(12) United States Patent
Shen

(10) Patent No.: US 6,501,291 B1
(45) Date of Patent: Dec. 31, 2002

(54) TESTING BASE FOR SEMICONDUCTOR DEVICES

(75) Inventor: Ming-Tung Shen, Taipei (TW)

(73) Assignee: CTS Computer Technology System Corporation, Taipei (TW)

(*) Notice: Subject to any disclaimer, the term of this patent is extended or adjusted under 35 U.S.C. 154(b) by 17 days.

(21) Appl. No.: 09/669,578

(22) Filed: Sep. 26, 2000

(30) Foreign Application Priority Data

Jul. 13, 2000 (TW) .................................. 089212057 U (51) Int. Cl.⁷ .............................................. G01R 31/26
(52) U.S. Cl. ...................... 324/765; 324/757; 324/763
(58) Field of Search ................................ 324/760, 765, 324/755, 763, 754, 158.1, 750, 757, 758; 216/14; 439/65; 438/14, 15, 455; 257/48; 29/830, 842

(56) References Cited

U.S. PATENT DOCUMENTS 5,639,385 A * 6/1997 McCormick ................. 216/14
5,886,535 A * 3/1999 Budnaitis ..................... 324/760
6,320,397 B1 * 11/2001 Wood ........................... 324/755

* cited by examiner

Primary Examiner—Michael Sherry
Assistant Examiner—Trung Nguyen
(74) Attorney, Agent, or Firm—Ladas & Parry (57) ABSTRACT

A testing base for a semiconductor device includes a retaining seat, a base board and a press unit. The retaining seat has a top side formed with a receiving cavity. The receiving cavity is adapted to receive the semiconductor device therein. The base board is mounted in a bottom portion of the receiving cavity of the retaining seat. The base board has a contacting side that confronts a contact mounting side of the semiconductor device when the semiconductor device is received in the receiving cavity. The contacting side is provided with a plurality of conductive contact pads adapted to connect electrically and respectively with contact members on the contact mounting side of the semiconductor device. The base board further has a plurality of contact terminals that extend outwardly through the retaining seat and that are connected electrically to the contact pads. The press unit is mounted on the retaining seat and is operable so as to press the semiconductor device toward the base board to ensure electrical connection between the semiconductor device and the base board.

19 Claims, 8 Drawing Sheets

TESTING BASE FOR SEMICONDUCTOR DEVICES

BACKGROUND OF THE INVENTION

1. Field of the Invention

The invention relates to a testing base for semiconductor devices, more particularly to a testing base for semiconductor devices of different specifications.

2. Description of the Related Art

In the fabrication of semiconductor devices, it is important to test the semiconductor devices. Due to the different specifications of the semiconductor devices, it is necessary to prepare testing bases having different specifications for the semiconductor devices, thereby resulting in higher fabrication costs.

SUMMARY OF THE INVENTION

Therefore, the object of the present invention is to provide a testing base suitable for use with semiconductor devices of different specifications.

According to the present invention, a testing base for a semiconductor device includes a retaining seat, a base board and a press unit.

The retaining seat has a top side formed with a receiving cavity. The receiving cavity is adapted to receive the semiconductor device therein.

The base board is mounted in a bottom portion of the receiving cavity of the retaining seat. The base board has a contacting side that confronts a contact mounting side of the semiconductor device when the semiconductor device is received in the receiving cavity. The contacting side is provided with a plurality of conductive contact pads adapted to connect electrically and respectively with contact members on the contact mounting side of the semiconductor device. The base board further has a plurality of contact terminals that extend outwardly through the retaining seat and that are connected electrically to the contact pads.

The press unit is mounted on the retaining seat and is operable so as to press the semiconductor device toward the base board to ensure electrical connection between the semiconductor device and the base board.

BRIEF DESCRIPTION OF THE DRAWINGS

Other features and advantages of the present invention will become apparent in the following detailed description of the preferred embodiments with reference to the accompanying drawings, of which.

DETAILED DESCRIPTION OF THE PREFERRED EMBODIMENTS

Before the present invention is described in greater detail, it should be noted that like elements are denoted by the same reference numerals throughout the disclosure.

Figure 1:
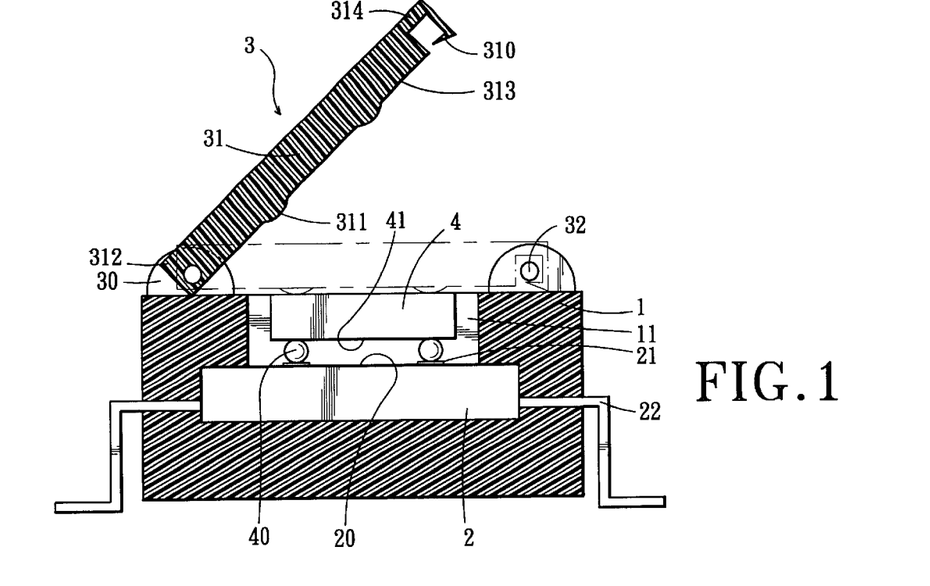
FIG. 1 is a partly schematic sectional view of the first preferred embodiment of a testing base for a semiconductor device according to this invention.
Figure 2:
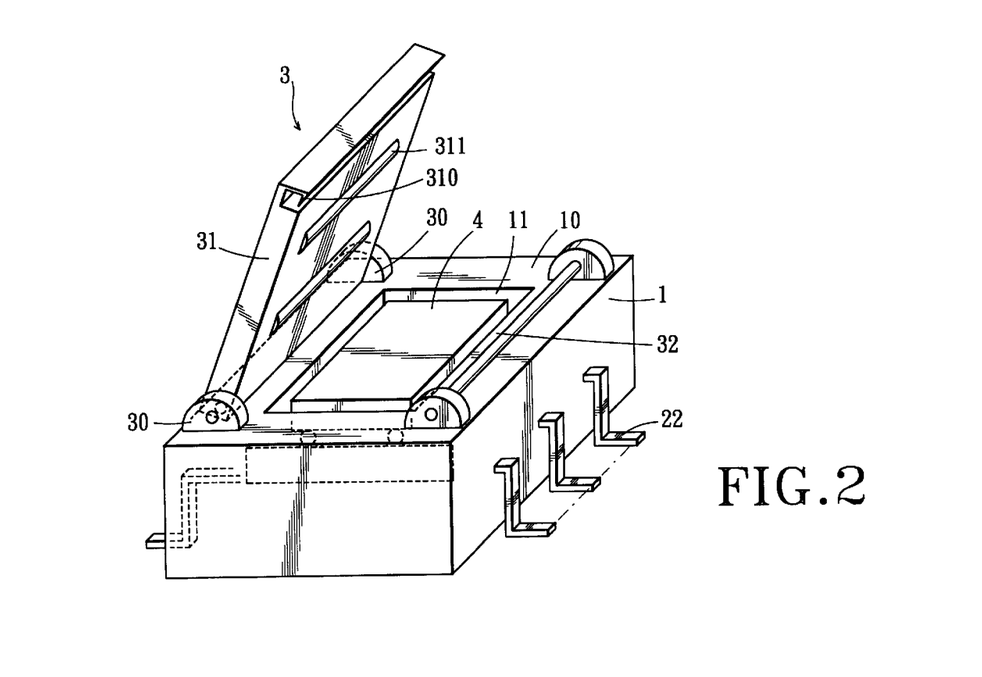
FIG. 2 is a perspective view of the first preferred embodiment.

Referring to FIGS. 1 and 2, according to the first preferred embodiment of this invention, a testing base for a semiconductor device 4 is shown to include a retaining seat 1, a base board 2, and a press unit 3.

The retaining seat 1, which is made of insulation material, has a top side 10 formed with a receiving cavity 11. The receiving cavity 11 is adapted to receive the semiconductor device 4 therein.

The base board 2, such as a printed circuit board, is mounted in a bottom portion of the receiving cavity 11 of the retaining seat 1. The base board 2 has a contacting side 20 that confronts a contact mounting side 41 of the semiconductor device 4 when the semiconductor device 4 is received in the receiving cavity 11. The contacting side 20 is provided with a plurality of conductive contact pads 21 adapted to connect electrically and respectively with contact members 40, in the form of tin balls, on the contact mounting side 41 of the semiconductor device 4. The base board 2 further has a plurality of contact terminals, 22 that extend outwardly through the retaining seat 1 and that are connected electrically to the contact pads 21. The contact terminals 22 are adapted to connect electrically with a testing circuit (not shown).

The press unit 3 is mounted on the retaining seat 1 and is operable so as to press the semiconductor device 4 toward the base board 2 to ensure electrical connection between the semiconductor device 4 and the base board 2. The press unit 3 includes a cover plate 31 having a first edge 312, a second edge 314 opposite to the first edge 312, and a bottom side 313. The top side 10 of the retaining seat 1 is formed with a pair of pivot lugs 30 adjacent to the receiving cavity 11. The top side 10 of the retaining seat 1 is further provided with an anchoring rod 32. The first edge 312 is disposed between and is mounted pivotally to the pivot lugs 30 on the top side 10 of the retaining seat 1 about a horizontal axis. The cover plate 31 is movable relative to the retaining seat 1 between a pressing position, wherein the bottom side 313 of the cover plate 31 is proximate to the top side 10 of the retaining seat 1 to enable the cover plate 31 to apply a pressing force to the semiconductor device 4, and a releasing position, as shown in FIG. 2, wherein the bottom side 313 of the cover plate 31 is remote from the top side 10 of the retaining seat 1 such that the cover plate 31 ceases to apply the pressing force to the semiconductor device 4. The second edge 314 of the cover plate 31 is formed with a hook member 310 that is capable of hooking removably on the anchoring rod 32 to retain releasably the cover plate 31 in the pressing position (as shown by the dotted lines in FIG. 1). The bottom side 313 of the cover plate 31 has a plurality of resilient members 311 mounted thereon for applying the pressing force to the semiconductor device 4.

Figure 3:
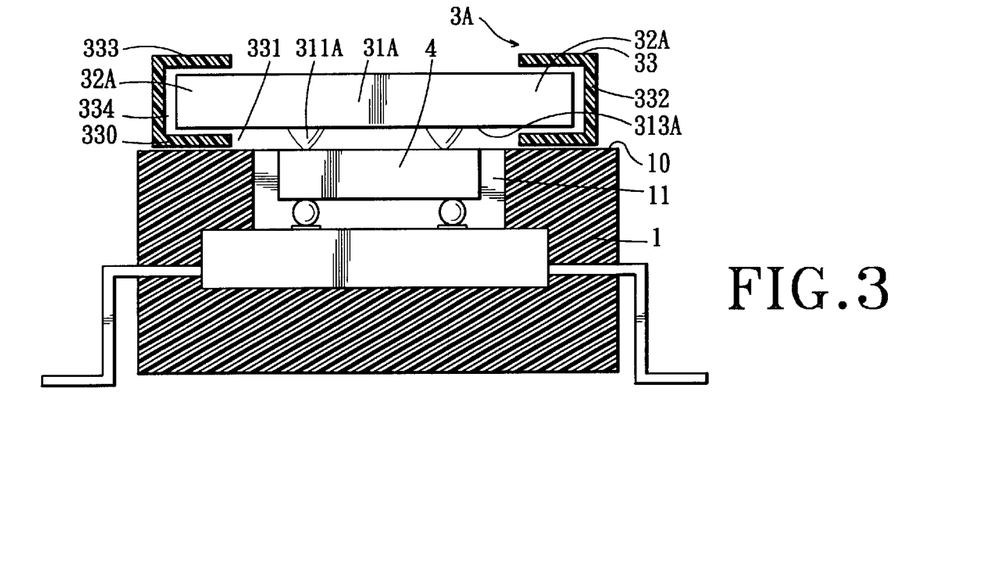
FIG. 3 is a partly schematic sectional view of the second preferred embodiment of a testing base for a semiconductor device according to this invention.
Figure 4:
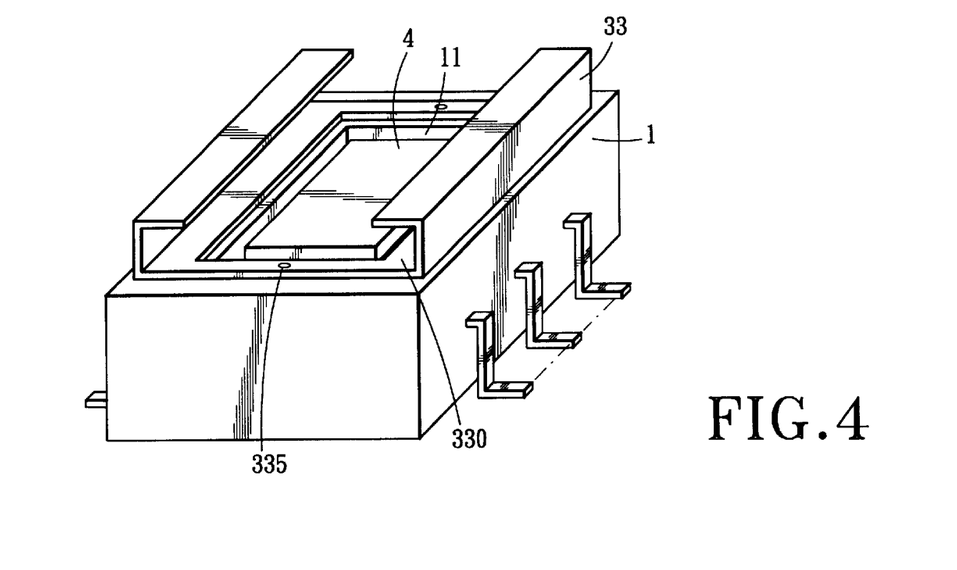
FIG. 4 is a perspective view of the second preferred embodiment.

FIGS. 3 and 4 illustrate the second preferred embodiment of a testing base for the semiconductor device 4 according to this invention, which is a modification of the first preferred embodiment. Unlike the previous embodiment, the press unit (3A) includes a cover plate (31A) and a mounting frame 33.

The cover plate (31A) has opposite edges (32A) mounted slidably on the top side 10 of the retaining seat 1, and a bottom side (313A). The cover plate (31A) is movable relative to the retaining seat 1 between a pressing position, as shown in FIG. 3, wherein the bottom side (313A) of the cover plate (31A) is disposed immediately above the receiving cavity 11 to enable the cover plate (31A) to apply a pressing force to the semiconductor device 4, and a releasing position, as shown in FIG. 4, wherein the bottom side (313A) of the cover plate (31A) ceases to cover the receiving cavity 11 such that the cover plate (31A) ceases to apply the pressing force to the semiconductor device 4. The bottom side (313A) of the cover plate (31A) has a plurality of resilient members (311A) mounted thereon for applying the pressing force to the semiconductor device 4.

The mounting frame 33 is mounted on the top side of the retaining seat 1 by means of screw fasteners 335. The mounting frame 33 has a base portion 330 formed with an opening 331 that is aligned with the receiving cavity 11 to permit insertion and removal of the semiconductor device 4 into and from the receiving cavity 11, a parallel pair of vertically extending first wall portions 332 that extend upwardly from the base portion 330 and that are spaced apart from each other to confine a slide channel 334 therebetween, and a pair of horizontally extending second wall portions 333 that extend respectively from the first wall portions 332 toward each other. The cover plate (31A) is slidably and removably disposed in the slide channel 334. The second wall portions 333 abut against the opposite edges (32A) of the cover plate (31A) so as to hinder upward movement of the cover plate (31A) when the cover plate (31A) is disposed in the slide channel 334.

Figure 5:
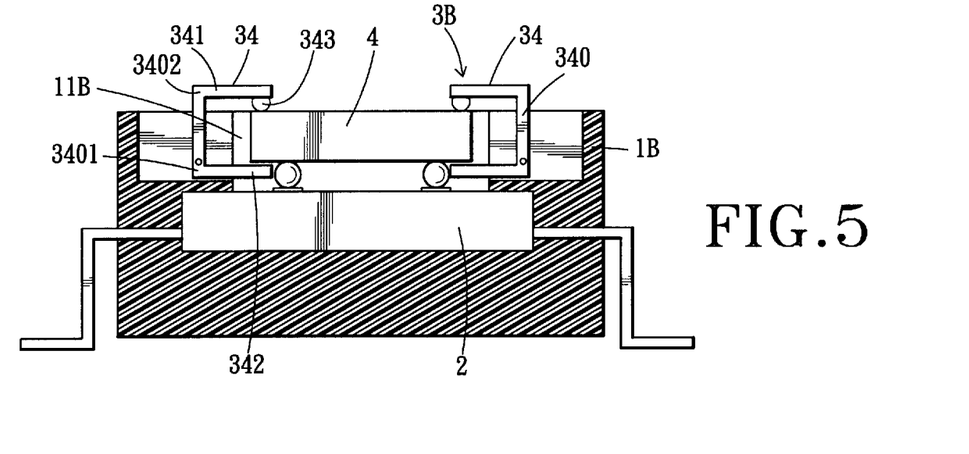
FIG. 5 is a schematic sectional view of the third preferred embodiment of a testing base for a semiconductor device according to this invention.
Figure 6:
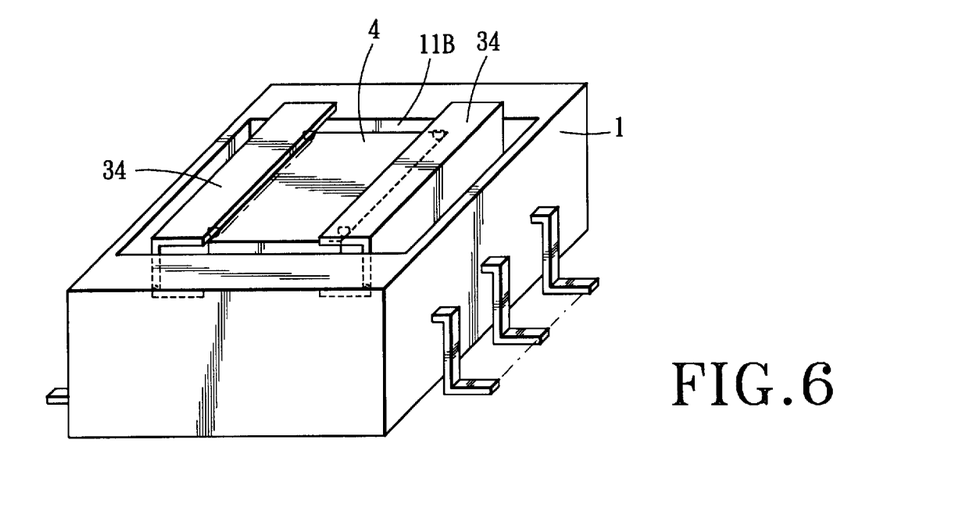
FIG. 6 is a perspective view of the third preferred embodiment.
Figure 7:
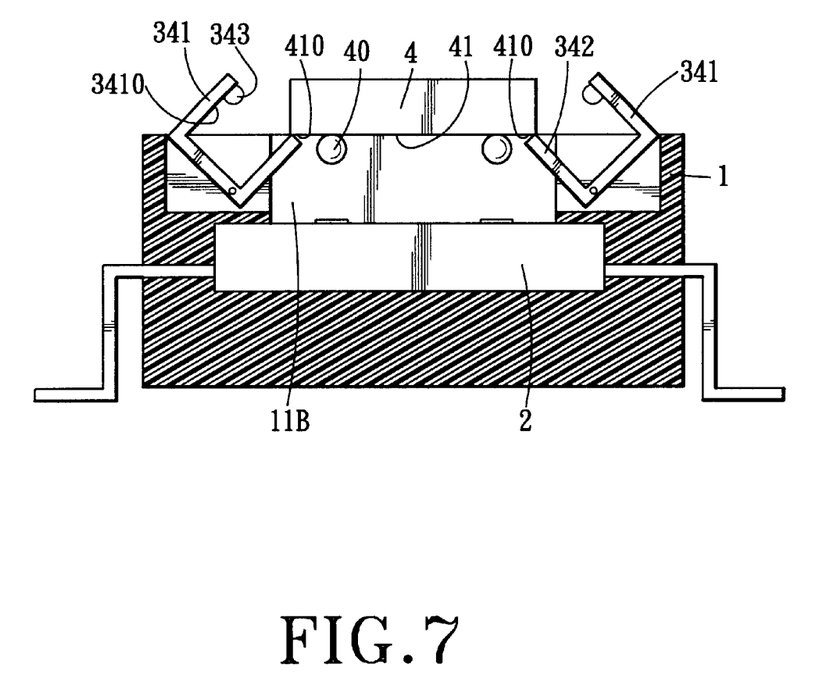
FIG. 7 is a schematic sectional view of the third preferred embodiment in a state of use.

FIGS. 5 to 7 illustrate the third preferred embodiment of a testing base for the semiconductor device 4 according to this invention, which is a modification of the first preferred embodiment. Unlike the first preferred embodiment, the press unit (3B) includes an opposing pair of retaining pieces 34 mounted in the receiving cavity (11B) of the retaining seat (1B).

Each of the retaining pieces 34 has a vertically extending base wall portion 340 with an upper end 3402 and a lower end 3401 mounted pivotally to the retaining seat (1B) about a horizontal axis, a horizontally extending lower wall portion 342 that extends from the lower end 3401 of the base wall portion 340 toward the other one of the retaining pieces 34, and a horizontally extending upper wall portion 341 that extends from the upper end 3402 of the base wall portion 340 toward the other one of the retaining pieces 34. The retaining pieces 34 are pivotable relative to the retaining seat (1B) toward each other from a releasing position, as shown in FIG. 7, wherein the lower wall portions 342 support opposite edges 410 of the contact mounting side 41 of the semiconductor device 4 such that the semiconductor device 4 is lifted away from the base board 2, and wherein the upper wall portions 341 do not extend above the semiconductor device 4 to permit insertion and removal of the semiconductor device 4 into and from the receiving cavity (11B), to a pressing position, as shown in FIGS. 5 and 6, wherein the lower wall portions 342 bring the semiconductor device 4 toward the base board 2, and wherein the upper wall portions 341 extend above and apply a pressing force to the semiconductor device 4. Each of the upper wall portions 341 has a bottom side 3410 with a resilient member 343 mounted thereon for applying the pressing force to the semiconductor device 4.

Figure 8:
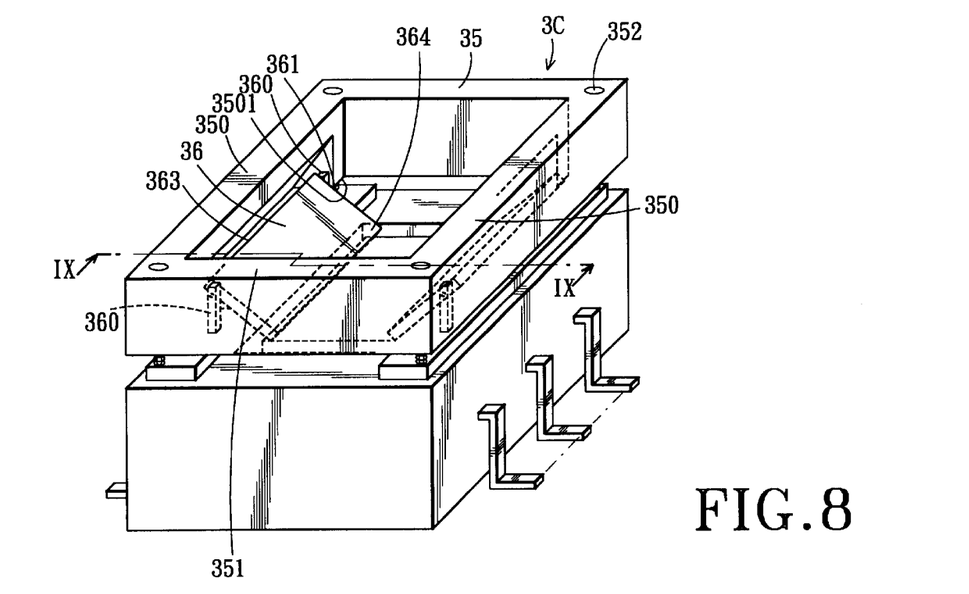
FIG. 8 is a perspective view of the fourth preferred embodiment of a testing base for a semiconductor device according to this invention.
Figure 9:
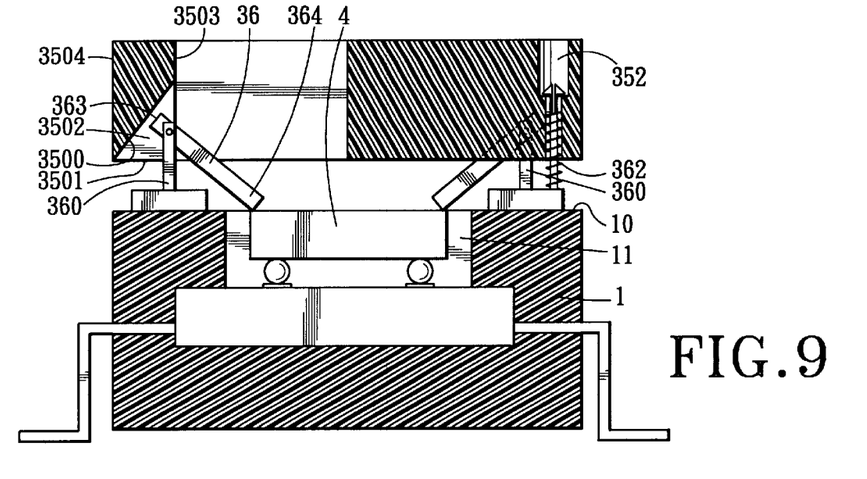
FIG. 9 is a schematic sectional view of the fourth preferred embodiment taken along line IX—IX in FIG. 8.
Figure 10:
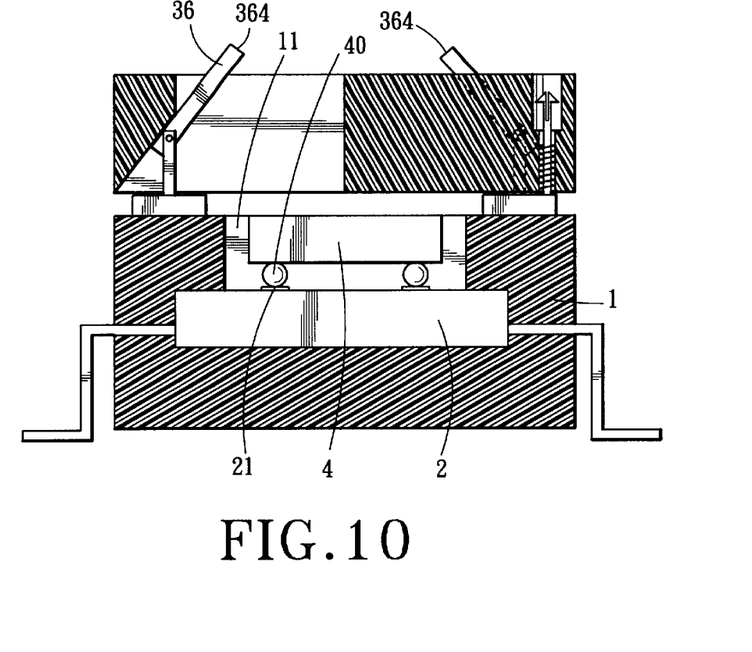
FIG. 10 is another view similar to FIG. 9 to illustrate the fourth preferred embodiment in a state of use.

FIGS. 8 to 10 illustrate the fourth preferred embodiment of a testing base for the semiconductor device 4 according to this invention, which is a modification of the first preferred embodiment. Unlike the first preferred embodiment, the press unit (3C) includes two opposing pairs of mounting posts 360 mounted on the top side 10 of the retaining seat 1 adjacent to the retaining cavity 11, two press plates 36, and a spring-loaded operating frame 35.

Each of the press plates 36 has a pivot end 363 disposed between and mounted pivotally on a respective one of the opposing pairs of the mounting posts 360, and a pressing end 364 opposite to the pivot end 363. The press plates 36 are movable relative to the retaining seat 1 about the pivot ends 363 between a pressing position, as shown in FIGS. 8 and 9, wherein the pressing ends 364 extend toward the retaining cavity 11 for applying a pressing force to the semiconductor device 4, and a releasing position, as shown in FIG. 10, wherein the pressing ends 364 are remote from the retaining cavity 11 and cease to apply the pressing force to the semiconductor device 4.

The operating frame 35 is mounted on the top side 10 of the retaining seat 1 by means of a plurality of spring-loaded bolts 362 that extend through the operating frame 35 via a plurality of mounting holes 352 formed in corner portions of the operating frame 35, and is biased away from the top side 10 of the retaining seat 1. The operating frame 35 is movable toward the top side 10 of the retaining seat 1 so as to engage the pivot ends 363 of the press plates 36 and cause the press plates 36 to move from the pressing position to the releasing position. In this embodiment, the operating frame 35 is a rectangular frame having a pair of press frame portions 350 and a pair of connecting frame portions 351 transverse to and interconnecting the press frame portions 350. Each of the press frame portions 350 has a bottom side 3501 formed with a recess 3502 to permit the pivot end 363 of a respective one of the press plates 36 to extend therein. Each of the press frame portions 350 has an inner frame side 3503 confronting the other one of the press frame portions 350, and an outer frame side 3504 opposite to the inner frame side 3503. The recess 3502 is defined by an inclined press wall 3501 that is disposed above the pivot end 363 of the respective one of the press plates 36 and that extends from the outer frame side 3504 to the inner frame side 3503 such that the depth of the recess 3502 increases from the outer frame side 3504 to the inner frame side 3503.

Figure 11:
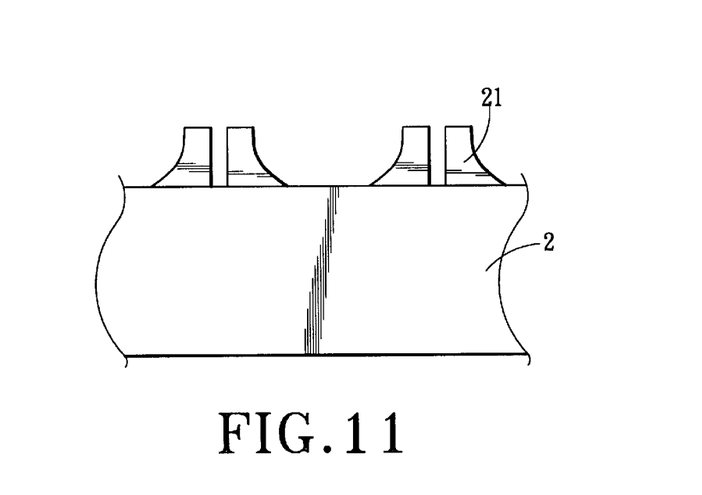
FIG. 11 is a fragmentary enlarged schematic side view showing a first embodiment of contact pads on a base board according to this invention.
Figure 12:
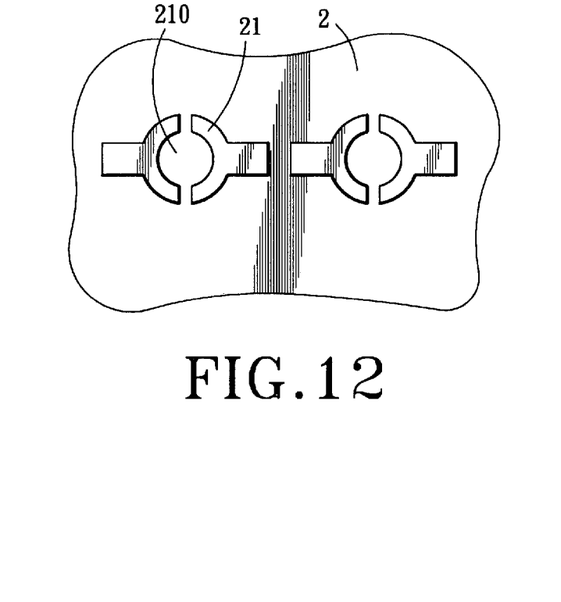
FIG. 12 is a schematic top view of FIG. 11.

FIGS. 11 and 12 illustrate a first embodiment of the contact pads 21 on the base board 2. The contact pads 21 are formed from conductive paste. Each of the contact pads 21 is formed with an upwardly opening recess 210 adapted to receive the respective one of the contact members 40 on the contact mounting side 41 of the semiconductor device 4. It is noted that the conductive paste can contain a conductive metal, such as gold, silver, copper, iron, tin or aluminum.

Figure 13:
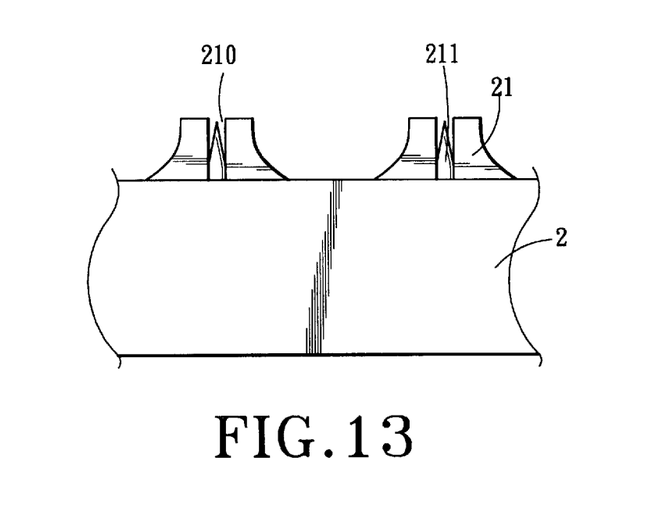
FIG. 13 is a fragmentary enlarged schematic side view showing a second embodiment of the contact pads on the base board according to this invention.

FIG. 13 illustrates a second embodiment of the contact pads 21 on the base board 2. Unlike the first embodiment of FIG. 11, each of the contact pads 21 further has an upwardly extending pin 211 formed in the recess 210 to ensure electrical connection between the contact pads 21 and the respective contact members on the semiconductor device in the event that oxidation of the contact members has occurred. The pin 211 is also formed from conductive paste.

Figure 14:
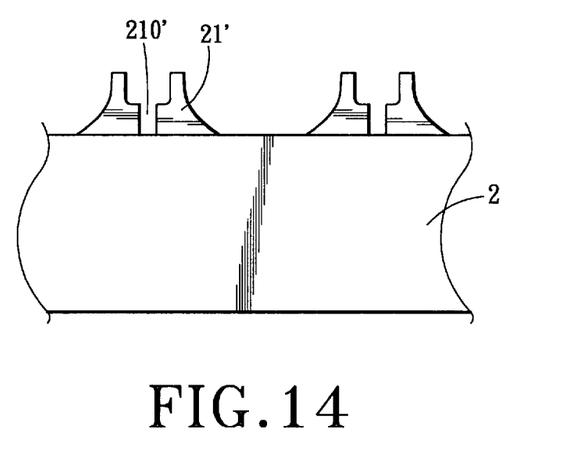
FIG. 14 is a fragmentary enlarged schematic side view showing a third embodiment of the contact pads on the base board according to this invention.

FIG. 14 illustrates a third embodiment of the contact pads 2' on the base board 2. Unlike the first embodiment of FIG. 11, the recess 210' has a wider upper portion and a narrower lower portion.

Figure 15:
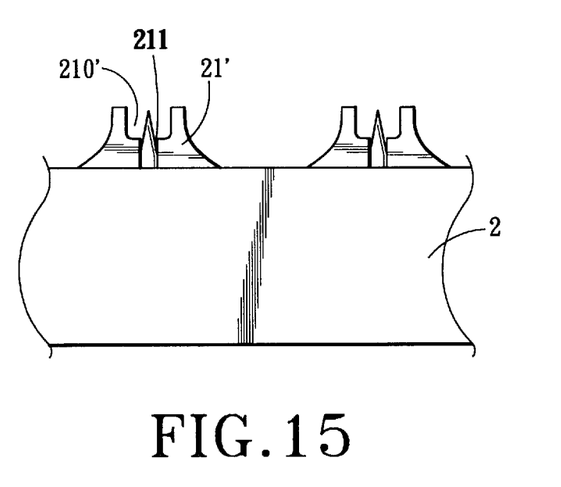
FIG. 15 is a fragmentary enlarged schematic side view showing a fourth embodiment of the contact pads on the base board according to this invention.

FIG. 15 illustrates a fourth embodiment of the contact pads 2' on the base board 2. Unlike the third embodiment of FIG. 14, each of the contact pads 21' further has an upwardly extending pin 211 formed in the recess 210' to ensure electrical connection between the contact pads 21" and the respective contact members on the semiconductor device.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A testing base for a semiconductor device, comprising:
   a retaining seat having a side with a receiving cavity, said receiving cavity being for receiving a semiconductor device therein;
   a base board at a portion of said receiving cavity, said base board having a contacting side that confronts a contact mounting side of the semiconductor device when the semiconductor device is received in said receiving cavity opposite said side, said contacting side having a plurality of conductive contact pads for connecting electrically and respectively with contact members on the contact mounting side of the semiconductor device, said base board further having a plurality of contact terminals that extend outwardly through said retaining seat and that are connected electrically to said contact pads; and
   a press unit on said retaining seat and operable to press the semiconductor device toward said base board to ensure the electrical connection of said contact pads.

2. The testing base of claim 1, wherein said contact pads are conductive paste.

3. The testing base of claim 2, for when the contact members are balls, wherein said contact pads have upwardly opening recesses for receiving respective ones of the contact members.

4. The testing base of claim 3, wherein said contact pads have pins respectively in said recesses.

5. The testing base of claim 4, wherein said pins are conductive paste.

6. The testing base of claim 1, wherein said press unit includes a cover plate having a first edge pivotally on said side of said retaining seat about an axis, and a pressing side, said cover plate being movable relative to said retaining seat between a pressing position, wherein said pressing side applies a pressing force to the semiconductor device, and a releasing position, wherein said pressing side is remote from said side of said retaining seat such that said cover plate ceases to apply the pressing force to the semiconductor device.

7. The testing base of claim 6, wherein said side of said retaining seat has a pair of pivot lugs adjacent to said receiving cavity, said first edge being disposed between and pivotally to said pivot lugs.

8. The testing base of claim 6, wherein said pressing side has at least one resilient member thereon for applying the pressing force to the semiconductor device.

9. The testing base of claim 6, wherein said press unit further includes a retaining unit for retaining releasably said cover plate in said pressing position.

10. The testing base of claim 6, wherein said cover plate has a second edge opposite to said first edge with a hook member, said side of said retaining seat being further provided with an anchoring rod for said hook to hook removably, whereby to retain releasably said cover plate in said pressing position.

11. The testing base of claim 1, wherein said press unit includes a cover plate having opposite edges mounted slidably on said side of said retaining seat, and a pressing side,
   said cover plate being movable relative to said retaining seat between a pressing position, wherein said pressing side applies a pressing force to the semiconductor device, and a releasing position, wherein said pressing side ceases to apply the pressing force to the semiconductor device.

12. The testing base of claim 11, wherein said press unit further includes a mounting frame mounted on said side of said retaining seat, said mounting frame having
   a base portion formed with an opening that is aligned with said receiving cavity to permit insertion and removal of the semiconductor device into and from said receiving cavity,
   a parallel pair of vertically extending first wall portions that extend from said base portion and that are spaced apart from each other to define a slide channel therebetween, said cover plate being slidably and removably disposed in said slide channel, and
   a pair of second wall portions that extend respectively from said first wall portions toward each other, said second wall portions abutting against said opposite edges of said cover plate so as to hinder upward movement of said cover plate when said cover plate is disposed in said slide channel.

13. The testing base of claim 11, wherein said pressing side of said cover plate has at least one resilient member thereon for applying the pressing force to the semiconductor device.

14. The testing base of claim 1, wherein said press unit includes an opposing pair of retaining pieces mounted in said receiving cavity, each of said retaining pieces having: a base wall portion with a first end pivoted on said retaining seat about an axis, and an opposite end; a first wall portion that extends from said first end toward the other one of said retaining pieces; and an opposite wall portion that extends from said opposite end toward the other one of said retaining pieces;
   said retaining pieces being pivotable relative to said retaining seat toward each other from a releasing position, wherein said first wall portions support opposite edges of the contact mounting side of the semiconductor device such that the semiconductor device is lifted away from said base board and said opposite wall portions permit insertion and removal of the semiconductor device into and from said receiving cavity, to a pressing position, wherein said first wall portions bring the semiconductor device toward said base board and said opposite wall portions apply a pressing force to the semiconductor device.

15. The testing base of claim 14, wherein each of said opposite wall portions has a side with a resilient member thereon for applying the pressing force to the semiconductor device.

16. The testing base of claim 1, wherein said press unit includes:

two opposing pairs of mounting posts on said side of said retaining seat adjacent to said retaining cavity; and two press plates, each having a pivot end between and pivotally on a respective one of said opposing pairs of said mounting posts, and a pressing end opposite to said pivot end;

said press plates being movable relative to said retaining seat about said pivot ends between a pressing position, wherein said pressing ends apply a pressing force to the semiconductor device, and a releasing position, wherein said pressing ends are remote from said retaining cavity and cease to apply the pressing force to the semiconductor device.

17. The testing base of claim 16, wherein said press unit further includes a spring-loaded operating frame on said side of said retaining seat and biased away from said side of said retaining seat, said operating frame being movable toward said top side of said retaining seat so as to engage said pivot ends of said press plates and cause said press plates to move from the pressing position to the releasing position.

18. The testing base of claim 17, wherein said operating frame, is a rectangular frame having a pair of press frame portions and a pair of connecting frame portions transverse to and interconnecting said press frame portions, each of said press frame portions having a side formed with a recess to permit said pivot ends of respective of said press plates to extend therein.

19. The testing base of claim 18, wherein each of said press frame portions has an inner frame side confronting the other one of said press frame portions and an outer frame side opposite to said inner frame side, said recess being defined by an inclined press wall that is disposed above said pivot end of respective of said press plates and that extends from said outer frame side to said inner frame side such that depth of said recess increases from said outer frame side to said inner frame side.

* * * * *